United States Patent
Lackey

(10) Patent No.: US 8,411,809 B2
(45) Date of Patent: Apr. 2, 2013

(54) VARIABLE TIME DELAY CONTROL STRUCTURE FOR CHANNEL MATCHING

(75) Inventor: Raymond J. Lackey, Bohemia, NY (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/343,282

(22) Filed: Jan. 4, 2012

(65) Prior Publication Data
US 2012/0100809 A1    Apr. 26, 2012

Related U.S. Application Data

(63) Continuation of application No. 12/315,429, filed on Dec. 3, 2008, now Pat. No. 8,094,764.

(51) Int. Cl.
*H04L 7/00* (2006.01)

(52) U.S. Cl. ......... 375/354; 375/219; 375/296; 375/316; 375/130; 375/135; 375/136; 370/503; 370/504; 370/505; 358/409; 358/424; 712/12; 455/109

(58) Field of Classification Search ........... 375/354, 375/219, 296, 316, 130, 135, 136; 455/114, 455/109; 358/409, 424; 370/503, 504, 505; 712/12
See application file for complete search history.

(56) References Cited

U.S. PATENT DOCUMENTS

| 6,693,971 | B1 | 2/2004 | Kowalski | |
|---|---|---|---|---|
| 2005/0069063 | A1* | 3/2005 | Waltho et al. | 375/346 |
| 2007/0064923 | A1* | 3/2007 | Schmukler et al. | 379/406.1 |
| 2009/0080325 | A1* | 3/2009 | Parnaby | 370/201 |

\* cited by examiner

*Primary Examiner* — Zewdu Kassa
(74) *Attorney, Agent, or Firm* — Dilworth & Barrese, LLP; Michael J. Musella

(57) ABSTRACT

A cosite interference cancellation system is provided for improved rejection of a signal coupled from a transmission antenna into a local receive antenna in the presence of local multipath. The cosite interference cancellation system and associated method advantageously provide improved signal rejection by continuously controlling (adjusting) a matching time delay to reduce cosite interference.

6 Claims, 5 Drawing Sheets

VARIABLE TIME DELAY CONTROL STRUCTURE FOR CHANNEL MATCHING

CROSS-REFERENCE TO RELATED APPLICATIONS

This application is a continuation of U.S. patent application Ser No. 12/315,429, filed Dec. 3, 2008, now allowed, the contents of which is hereby incorporated by reference herein in its entirety.

FIELD OF THE INVENTION

The invention relates generally to the field of radio communication and, in particular, to the reduction of interference in signals coupled from a transmission antenna into a local receive antenna in the presence of a local multipath.

DESCRIPTION OF THE RELATED ART

Unwanted (i.e., interfering) signals manifest themselves in several ways. Interference can cause a reduction in the sensitivity of a receiver (receiver desensitization), masking of a desired signal, tracking of an undesired interfering signal and loss of the desired signal, and processing of the unwanted interfering signal instead of the desired signal. Each of these manifestations of interference limits the communication capabilities of the radio system afflicted by this problem. The effects of interference can be some combination of the absence of usable output from a receiver, false signals from a receiver, and malfunction of a device which is operated by the receiver. During emergency situations, the loss and corruption of the desired signal can be critical.

Unwanted signal interference is generally caused by modulation of signals provided to the receiver by the carrier waves, or by the wideband noise, generated by collocated transmitters. Unwanted signal interference also occurs when frequency-hopping transmitters are transmitting signals at frequencies that are substantially close to the frequency of the desired receiver signal (i.e., co-channel operation). Unwanted signal interference can also be caused by "pseudo white-noise" generated by transmitters over a wide band of frequencies on either side of the transmitter's operating frequency. It is often found in collocated transceiver systems that this "pseudo white-noise" reaches unacceptable levels within the operating band of adjacent receivers. Unwanted signal interference is also attributed to signals (i.e., spurious emissions) generated by transmitters at odd harmonics of the fundamental frequency of the transmitter output signal. This is caused by the non-linear transfer characteristics of amplifiers in the transmitter chain.

In order to substantially reduce and eliminate the undesired interfering signals while maintaining the spatial benefits afforded by proximately locating transceivers, especially frequency-hopping transceivers, several signal processing techniques have been proposed. These techniques include agile filtering, agile filtering with multicoupling and interference cancellation.

When the signal noise and spurious sidebands generated by the interfering transmitter are strong, broadband, and scenario dependant, standard interference cancellation is inadequate. Changes in the scenario surrounding the platform may vary the coupling between the transmitter and the protected receiver and thus require adjustment of system parameters in an adaptive process.

Interference cancellation involves sampling the transmitter output signal in order to eliminate from the received signal, any interfering signal having a frequency proximate to the receiver carrier frequency. In co-site environments, a collocated source usually interferes with the receiver due to the finite isolation between transmit and receive antennas. This interference in a co-site environment is a combination of several factors, desensitization caused by one or more nearby high-power transmitter carriers and wideband moderate to low-power interference components associated with those carriers. These interference components are received by the collocated radio and degrade system operation. The nearby high-power transmitter carrier signals could simply exist as a part of the platform signal environment. Further, the interfering signals may be classified as either cosite or remote interferers. A cosite interferer is physically collocated with the receiver on a platform permitting a physical circuit connection from the interference generator to the receiver. A remote interferer is located far enough from the receiver to preclude a physical circuit connection.

A typical Interference cancellation system utilizes a correlation-based adaptive controller using feedback derived after the cancellation process. The system takes a sample of an interference signal and adjusts the magnitude and phase such that the result is equal in amplitude and 180° out of phase with the interference signal at the input of the receiver. The vector sum of the two signals will cancel, leaving only the signal of interest. In practice, however, the two signals are not identical, due to unwanted distortion in the reference path, as well as differences in signal path lengths and non-ideal components in the Tx/Rx signal paths. Cancellation performance is a function of amplitude and phase match between the interference signal and the sampled signal. To suppress a wideband interference signal, the performance of a cancellation system is directly proportional to the path length match between the cancellation signal and the interference signal. For a modulated carrier, phase match is determined by the signal bandwidth and the path length difference in time (often measured in nanoseconds) between the transmit antenna to the receive antenna signal path and the coupled transmit signal path to the receive antenna.

In order to provide good signal suppression, the cancellation signal path length should be adjusted to time match the interference signal path length. Contemporary techniques for this adjustment involve manual measurements to determine the path length difference between the interference cancellation signal and the received interference signal. One prior art solution utilizes a manually controlled trombone to extend a tap to a proper delay. This solution is deficient to the extent that it only provides an approximate solution for a stationary environment and requires manual intervention. Conventional manual methods do not lend themselves to situations where the time match may change over the course of time as a result of a changing environment. Thus, a conventional interference cancellation system may suffer a loss of suppression performance due to system dynamics.

One prior art solution proposes the use of an adaptive time delay module which provides time-matched delays in auxiliary paths by providing additional taps in the auxiliary paths to cover a range of possible time delays. However, the taps only cover a discrete set of time-delays resulting in less than optimal results.

A further prior art solution proposes the use of a digital search method that requires an interrupt of the system operation for adjustment. This solution is deficient by requiring both system interruption and manual intervention.

A need therefore exists for a system and method for continuously adjusting a matching time delay where the time match may change over the course of time as a result of a changing environment.

SUMMARY OF THE INVENTION

It is therefore an object of the present disclosure to provide a method and apparatus for adjusting the delay in a controlled propagation path to that of an uncontrolled propagation path.

It is another object of the present disclosure to provide a method and apparatus for reducing the effects of interference between collocated transceivers.

It is yet another object of the present disclosure to provide a method and apparatus in which proximately located transceivers can simultaneously transmit and receive independent signals without substantially affecting the quality of a desired signal reception.

It is another object of the present disclosure to eliminate the effects of interference between collocated transceivers utilizing interference cancellation.

In one aspect, the invention provides a cosite interference cancellation system configured to provide improved rejection of a signal coupled from a transmission antenna into a local receive antenna in the presence of local multipath. The cosite interference cancellation system and associated method advantageously provide improved signal rejection over prior art approaches by continuously controlling (adjusting) a matching time delay to reduce cosite interference.

In accordance with one embodiment of the present disclosure a system for reducing interference in signals coupled from a transmission antenna into a local receive antenna in the presence of a local multi-path employs a time-delay based control architecture including delay means for continuously varying a delay match between a signal in one path relative to the other path. The system is based on a time-delay based control architecture which dynamically and continuously controls the matching time delay. A controlling means, associated with the delay means, provides improved matching of the signal in the two paths, transmitted and coupled, thereby enhancing the performance of the co-site interference cancellation system.

The inventor has recognized that an autocorrelation result between the transmitted reference signal and the continuously varied time-delayed version is indirectly proportional to the time-bandwidth product of the two multiplied signals. The time-bandwidth being defined herein as a product of the bandwidth and a time mismatch between the two signals. Desirably, for a large bandwidth signal, the autocorrelation result becomes highly sensitive to the measured time mismatch, which is trying to be reduced or minimized. Accordingly, in accordance with one embodiment of the present disclosure a method of reducing interference in signals coupled from a transmission antenna into a local receive antenna in the presence of a local multipath comprises a control process for dynamically adjusting the time mismatch, via a variable time delay element to maximize the autocorrelation between a transmitted reference signal and a continuously varied time-delayed version of the transmitted reference signal. Upon acquiring a state of maximum autocorrelation via the control process, the method further comprises adjusting the weight of the time-matched coupled signal for cancellation via minimizing the correlated error feedback signal. Upon acquiring a state of minimized correlated error feedback, the cosite interference is considered to be at a minimum.

According to one aspect, dynamic adjustment of the time-delay element considers both direction and degree in dependence upon the most recent autocorrelation result.

In different embodiments, the system may be implemented in discreet components or alternatively as a MMIC. Time delays can be implemented as either a switched delay or a continuously variable delay through an analog control voltage.

BRIEF DESCRIPTION OF THE DRAWINGS

These and other objects, features and advantages of the invention will be apparent from a consideration of the following Detailed Description Of The Invention considered in conjunction with the drawing Figures, in which.

DETAILED DESCRIPTION OF THE INVENTION

Figure 1:
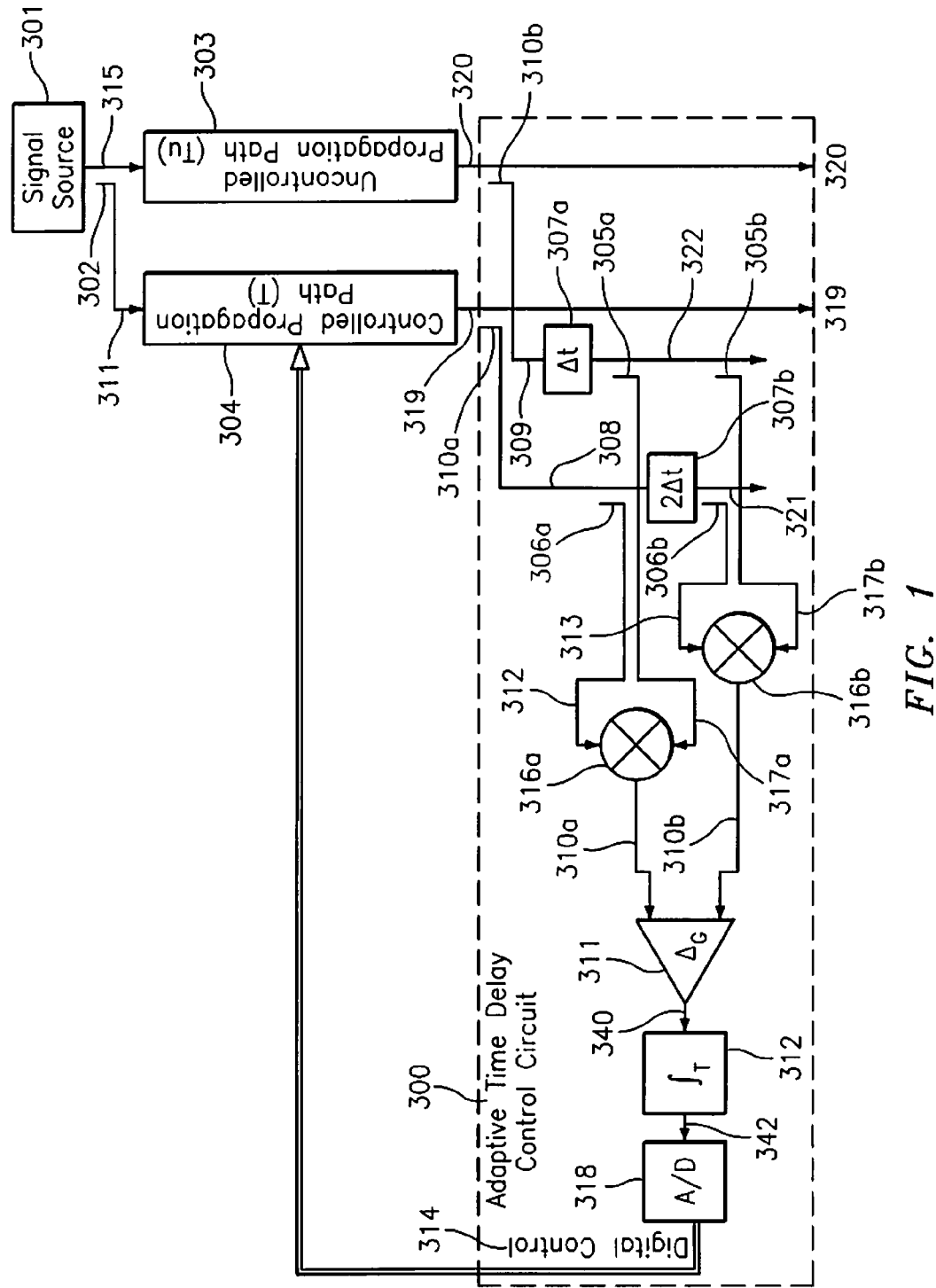
FIG. 1 illustrates the basic method of operation of the invention.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention and are considered to be within the understanding of persons of ordinary skill in the relevant art.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Overview

The present disclosure calculates an autocorrelation result between a transmitted reference signal and a coupled sample, time-delayed version of the reference signal, with the understanding that the autocorrelation result is indirectly proportional to the time-bandwidth product of the two multiplied signals. The time-bandwidth product being defined herein as a product of the bandwidth and a time mismatch between the two signals. Advantageously, for very broadband signals, the autocorrelation result becomes very sensitive to time mismatch. The present disclosure exploits this feature.

Operation

In operation, transmitter 21 transmits RF transmission signal 40 through antenna 2 which couples spatially 3 either directly or through a multipath environment into a second antenna 4 connected to a receiver 25 on the same platform as interfering transmitter 21. This coupled energy interferes with the reception in the receiver 25 of its desired reception of a distant transmission. The interfering transmitter 21 thus becomes a collocated source of interference. It is desired to protect the receiver 25 from the interfering transmitter 21. The addition of a simple Interference Cancellation System (ICS) consisting of only a coupled adaptive control loop (ACL) 6 can reduce this interference to a limited extent by sampling the transmission signal 7 and feeding it into the auxiliary port 8 of the ACL 6 while interfering antenna signal 30, including both the interfering propagated reference signal and the desired signal, is fed into the reference port 9 of the ACL 6.

In an environment clear of reflective obstacles (e.g., no multi-path sources present), the spatially coupled signal 3 from antenna 2 to antenna 4 would be received unchanged except for the propagation delay which would be fixed. However, in a typical multi-path laden environment, the dominant path of the spatially coupled signal 3 varies with a changing multipath environment of a platform in motion.

In the embodiments to be described, a signal, transmitted from a transceiver, is correlated with two separate and distinct delayed versions of itself (in a two tap embodiment), with the respective autocorrelation results being indirectly proportional to the product of the signal bandwidth and relative delta time difference. In a two-tap configuration, each of the two time-delayed sample signals has different time mismatches with the reference signal. The time mismatches are purposefully designed to provide sufficient autocorrelation differences that can be sensed and used to control the time delay adjustment of a variable delay line until a steady-state solution is reached where the two taps bracket the desired (ideal) time delay relative to the reference signal which allows weighting and summation and thus minimizes interference.

In accordance with a method for minimizing interference between two or more co-located transceivers, it is contemplated to measure the respective time mismatch autocorrelations to determine their relative magnitudes and adjust the respective coupled signal time delay so as to arrive at the desired (ideal) time delay, matching the propagated signal path length, thus allowing minimization of interference.

In one embodiment, in a two tap configuration, a tracking loop measures the respective time delay autocorrelations (i.e., A and B) and compares them by taking a difference value (A-B) to adjust the time delay in a manner which converges on the desired (ideal) time delay.

Referring now to the drawings, FIG. 1 is a top-level illustration of a system of the invention. A more detailed system description is provided below with reference to FIG. 3.

With reference now to FIG. 1, an arbitrary signal source 301, outputs a signal 315. A copy of the output signal is extracted in coupler 302 as signal 311. It is noted that signals 311 and 315 are identical. Signal 311 is a signal intended to be propagated over a controlled propagation path 304 having a known propagation time delay T. Mirror signal 315 is propagated over an uncontrolled propagation path 303. The time delay, $T_u$, associated with uncontrolled propagation path 303 is indeterminate.

It should be understood that a primary objective of the adaptive time delay control circuit 300 of FIG. 1 is to compensate for this indeterminate time delay, $T_u$, associated with the uncontrolled path, by adjusting a variable time delay element (not shown) of the adaptive time delay control circuit 300 such that the known propagation time delay T associated with the controlled propagation path 304 is matched to the uncontrolled propagation time $T_u$ associated with the uncontrolled propagation path 303. The adaptive time delay control circuit 300 of FIG. 1 is configured to perform this time matching function, described as follows.

Controlled Propagation Path 304

Signal 311, output from signal source 301, enters the controlled propagation path 304 and exits as signal 319 after a time interval T. Signal 319 is sensed in an ideal coupler 310a for off-line processing as signal 308. Signal 308 is sampled in ideal coupler 306a to create signal 312 as a synchronous sample of signal 319. Signal 308 is delayed for a controlled time T from the signal 315 output from signal source 301. In addition to being sampled in ideal coupler 306a, signal 308 also enters delay line 307b having a fixed delay 2Δt, where it is sensed in ideal coupler 306b to form signal 313, delayed a controlled time T+2Δt from the original signal 315.

Uncontrolled Propagation Path 303

Signal 315 enters the uncontrolled propagation path 303 and exits as a component of signal 320 after some unknown interval $T_u$. In other words, other signals may have been combined with the original signal 315 in the uncontrolled propagation path 303. The exit signal 320 is sensed in an ideal coupler 310b for off-line processing as signal 309. Signal 309 enters delay line 307a having a fixed delay Δt, and exits as signal 322, delayed an uncontrolled time from the original signal 315 at $T_u$+Δt Signal 322 is sensed in ideal couplers 305a and 305b to form signal 317a and 317b, each delayed an uncontrolled time $T_u$+Δt from the original signal 315.

Signal 317a, a signal having a delay of $T_u+\Delta t$ relative to original signal 315, when correlated in ideal correlator 316a with signal 312, a signal having a delay of T relative to original signal 315, generates the autocorrelation value 310a of signal 315 for a decorrelation interval of $T_u-T+\Delta t$.

Signal 317b, a signal having a delay of $T_u+\Delta t$ relative to original signal 315, when correlated in ideal correlator 316b with signal 313, a signal having a delay of $T+2\Delta t$ relative to original signal 315, generates the autocorrelation value 310b of signal 315 for a decorrelation interval of $T_u-T-\Delta t$.

Figure 2:
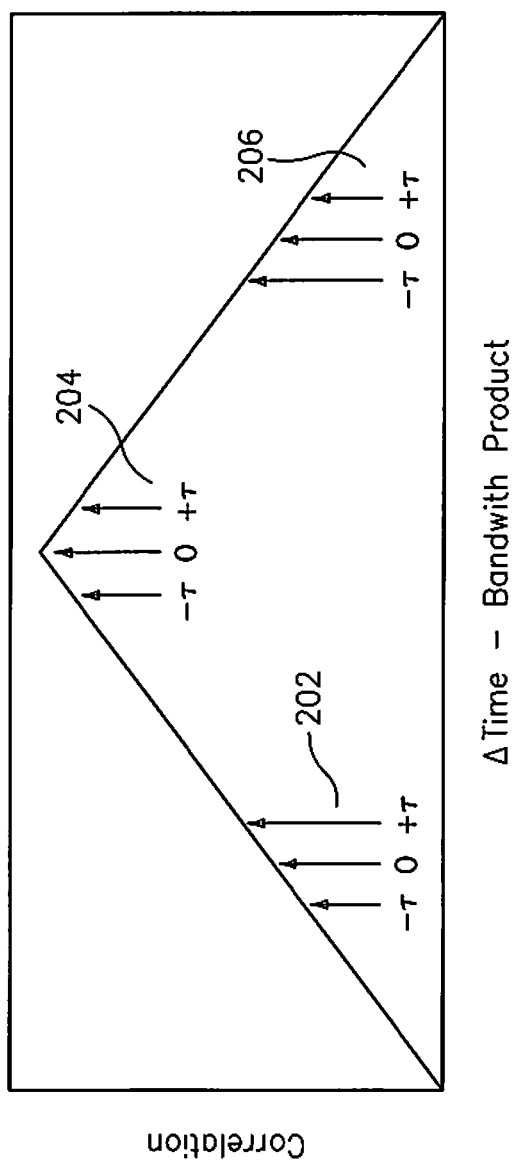
FIG. 2 is a diagram of signal autocorrelation of a signal with a rectangular spectrum as a function of the product of $\Delta T$ and Bandwidth showing three exemplary locations of the controlling taps relative to the current delay time in respect to its match to the reference path delay.

With reference now to FIG. 2, there is shown by way of example, possible relative values of the two autocorrelation results 310a and 310b which are output from autocorrelators 316a and 316b, respectively. The autocorrelation results are directly dependent upon the values of T (associated with the controlled propagation path) and $T_u$ (associated with the uncontrolled propagation path). The autocorrelation results 310a and 310b are generated, with an imaginary autocorrelation centered between them corresponding to the auto correlation of signal 315 with a decorrelation interval of $T_u-T$. Controlled Propagation path delay T<Uncontrolled Propagation Path delay $T_u$ If the value of T associated with the controlled propagation path 303 is lower than $T_u$, the delay associated with the uncontrolled propagation path 304, the autocorrelation result will be greater for output 310b for a decorrelation interval of $(T_u-T+\Delta t)$ than for the autocorrelation result 310a for a decorrelation interval of $(T_u-T-\Delta t)$ as shown in FIG. 2 at 202. Controlled Propagation path delay T>Uncontrolled Propagation Path delay $T_u$ However, if the value of T associated with the controlled propagation path 303 is greater than the delay $T_u$ associated with the uncontrolled propagation path 304, the autocorrelation result will be greater for output 310a for a decorrelation interval of $(T_u-T-\Delta t)$ than for output 310b for a decorrelation interval of $(T_u-T+\Delta t)$ 310b as shown in FIG. 2 at 206.

The difference found in subtracting the two autocorrelation values 310a and 310b in subtractor 311, yields an error signal 340 that is amplified and integrated in 312 to remove noise-yielding signal 342. The amplified and integrated control signal 342 is then converted in A/D 318 yielding a digital control word 314. A new value for the digital control word 314 changes the value of delay T associated with the controlled transmission path 304. The process repeats continuously until a steady state is reached when $T_u$ equals T as shown in FIG. 2 at 204, as the error signal 340 goes to zero.

It should be understood that the autocorrelation result correlating the two signals 319 and 320 is not formed and is never used for purposes of control but is instead included only by way of example in FIG. 2, as the center unit in the clusters of three.

Thus, it is shown that a delayed replica of a signal in a controlled propagation path has been delayed for an interval equal to the unknown delay of an uncontrolled propagation path, where other signals may have been added, for applications where desired for additional signal processing. The value of $T_u$ is then the value T for the steady state value of the digital control word, so the delay $T_u$ is now known.

Figure 3:
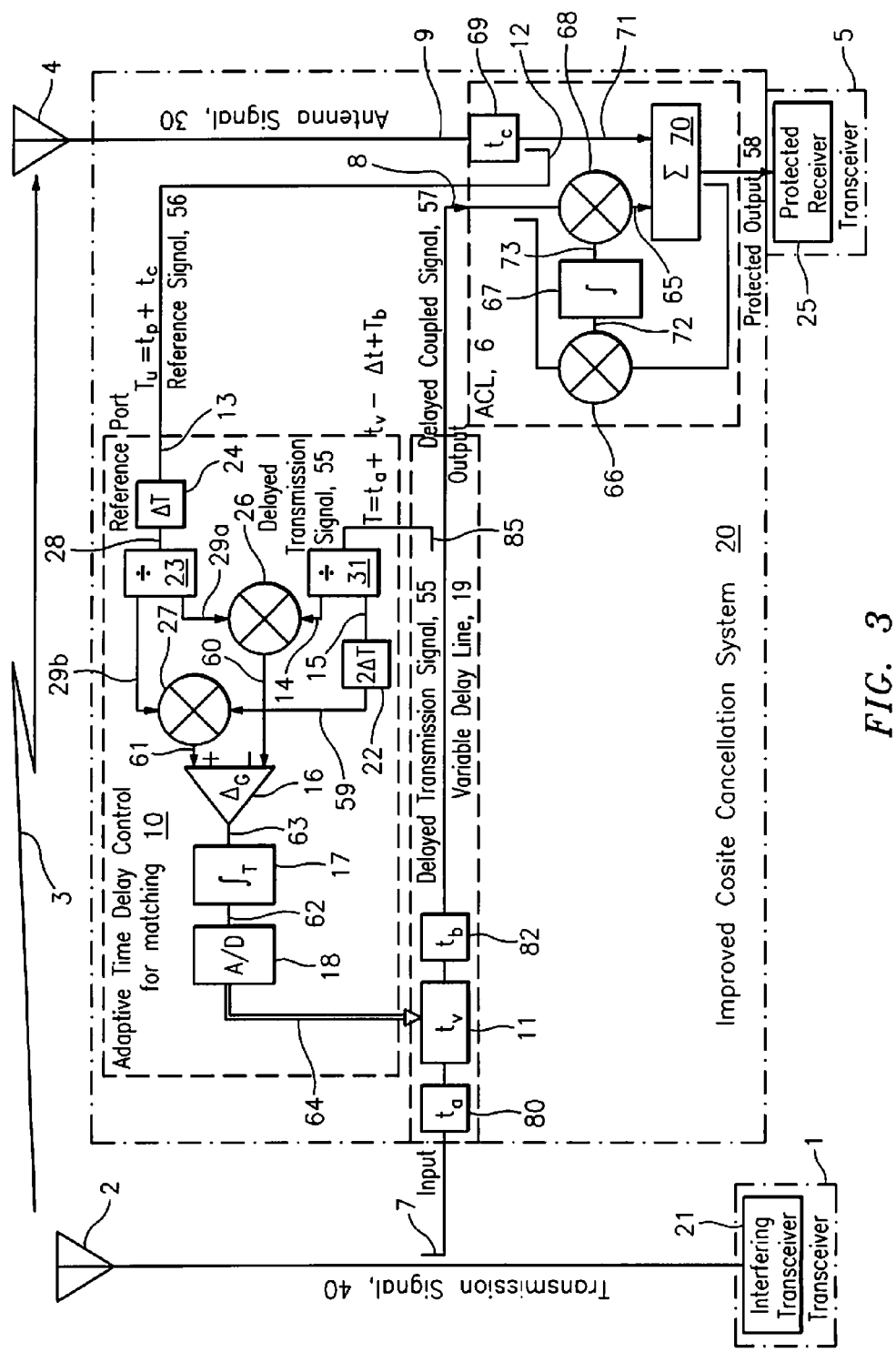
FIG. 3 illustrates a cancellation circuit for elimination of interfering signals between radio transceivers, according to one embodiment.

FIG. 3 illustrates one embodiment of an improved cosite interference cancellation system 20 for elimination of interfering signals between two or more co-located transceivers, two of which are shown for ease of explanation, i.e., transceivers 1, 5. As shown in FIG. 3, a first transceiver 1 including a radio transmitter 21, and a second transceiver 5 including a protected receiver 25.

In operation, system dynamics cause changes in the coupling between a transmit antenna 2 of transceiver 1 and a receive antenna 4 of transceiver 5 on a co-located platform necessitating dynamic, real-time corrective measures to compensate for the changing dynamics. The invention provides these corrective measures, as will be described.

It is noted that the transceivers 1, 5 can operate at any Rf frequency including, for example, in the high frequency (HF), very high frequency (VHF) and ultra-high frequency (UHF) spectrums.

It should be understood that in different embodiments, the cosite cancellation system for the elimination of interfering signals between radio transceivers 1, 5, is adapted to be coupled to either transceiver 1, transceiver 5 or other type of device capable of transmitting and/or receiving electronic signals. It should be understood, however, that while the presently described exemplary embodiment assigns transceiver 1 as an interfering transmitter and further assigns transceiver 5 as a protected receiver, each transceiver 1, 5 may function independent of the other transceiver such that they alternate in being viewed as either the interfering transmitter or protected receiver depending upon the specific needs of the user. For ease of explanation, however, the following description will only address a single functional aspect.

In order to substantially eliminate the effect of interfering signals introduced by transceiver 1, an improved cancellation system 20, according to one embodiment, is electrically coupled to transceiver 5, the operation of which is to be described as follows.

With continued reference to FIG. 3, interfering transmitter 21 of transceiver 1 transmits an RF signal through antenna 2 which couples spatially 3 either directly or through a multipath environment into a second antenna 4 connected to a receiver 25 of transceiver 5 on the same platform. Without the aid of improved cosite cancellation system 20, this coupled energy interferes in a non-protected receiver with its desired reception of a distant transmission. The interfering transmitter 21 thus becomes a collocated source of interference. Therefore, it is desired to protect the receiver 25 from the interfering transmitter 21. This is achieved via improved cosite cancellation system 20 to reduce this unintended interference.

In an embodiment, the cancellation system 20 is comprised of an adaptive time delay control (ATDC) module 10 and an inline variable delay 19. The ATDC 10 is configured to adjust the inline variable delay 19. As shown, Inline variable delay 19 is comprised of conventional cable delay, $t_a$ 80, fixed delay element $\Delta T$ 22, variable delay element $(T-\Delta T)$ 11. In some embodiments, Placeholder $t_b$ 82 may be included as part of variable delay line 19. Placeholder $t_b$ 82 refers to all other signal processing functions that may be used with inline delay, either fixed or variable. The fixed and variable delay elements are configured to match a dynamically changing spatial coupling delay between antenna 2 and antenna 3, the uncontrolled propagation path. The fixed delay element $\Delta T$ 22 of variable delay line 19 is positioned after sample point 85 to compensate for a centering delay 24 in the reference signal 56 path while maintaining the time matches into ports 8 and 9 of the adaptive control loop (ACL) 6. Other embodiments may further include a pedestal delay $t_c$ 69, which can be a fixed or a variable delay, in the antenna signal path 30 to allow the insertion of implementation delays or additional signal processing functions in the variable delay line 19. Herein, inline refers to an action or process that generates an immediate change, upon signals passing through, at the output of the circuit where offline refers to action or processes that may use samples of signals passing through but do not impact the signals passing through until a result is reached and a change is made to the inline processes.

The cancellation system 20 further includes an adaptive control loop (ACL) 6 configured to perform instantaneous adjustments of the time-adjusted coupled signal input 9, in both phase and amplitude, to maximize the cancellation of the transmission path interference antenna signal 30.

In operation, cosite interference cancellation system 20 samples, via coupler 7, a transmission signal 40 emitted from interfering transmitter 21 of transceiver 1. The transmission signal 40 is preferably sampled just before the transmitting antenna 2, specifically at transmission sample pickup point 7. The sampled transmission signal 40 is provided as one input to the fixed cable delay 80, $t_a$ of variable delay line 19.

It should be appreciated that, as the environment changes, the spatial coupling delay between antenna 2 and antenna 4 is dynamically changing over time. To compensate for the dynamically changing spatial coupling delay, an adaptive time delay control module (ATDC) 10 adjusts the inline variable delay 19 to match the dynamically changing spatial coupling delay. The matching process performed by the ATDC module 10 is required by the adaptive control loop (ACL) 6 to achieve maximum cancellation of the undesired interfering antenna signal 30 in the dynamically changing environment.

As part of this process of compensation for the dynamically changing spatial coupling delay, a fixed cable delay 80, $t_a$, is ideally adjusted to maximize the useful operating range of the variable time delay element 11, T–ΔT, such that the totality of delays introduced between points 7 and 8, when summed with the variable time delay element 11 at its minimum setting, will have the minimum typical spatial coupling delay from antenna 2 to antenna 4 as when there is a direct path with no multipath delays. It should therefore be understood that the fixed cable delay 80, $t_a$, represents a baseline delay for a baseline case for the direct path with no multipath delays. This baseline delay is dynamically adjusted for greater delays as needed to compensate for multipath delays.

Adaptive Time Delay Control Circuit 10

The adaptive time delay control circuit (ATDC) 10 requires two inputs. A first input, received at reference port 13. The first signal is a reference signal 56 which is a sample of the interfering antenna signal 30 of the reference antenna sampled through a coupler 12. A second input to ATDC 10 is a delayed transmission signal 55, which is sampled at sample point 85 of the variable delay line 19. The sample point 85 is located downline from all of the coupled path delays of variable delay line 19 except path delay 22 ΔT. Splitter 31 of ATDC 10 splits the delayed transmission signal 55 into two signals, i.e., an early (0 delay) signal 14 and a late signal path 15, further delayed (2ΔT delay) to become the late path offset delayed transmission signal 59. Each of the two signals 14, 59 are correlated with respective delayed samples 29a, 29b of reference signal 56. The delayed samples 29a, 29b are derived from signal 28 having a centering delay 24 of (ΔT).

In one embodiment, the autocorrelation may be performed by a simple mixing process, to form two samples of autocorrelation 60, 61 with time. Other well known and future envisioned techniques for performing autocorrelation, convolution or equivalent process are within contemplation of the invention.

With continued reference to FIG. 3, to form autocorrelation sample 60, mixer 26 receives a first input of delayed reference 29a from divider 23 and a second input of the early signal 14. To form autocorrelation sample 61, mixer 27, similarly receives a first input of delayed reference 29b from divider 23 and its second from the late signal 59. The two-autocorrelation samples 60, 61 are differenced, such as shown in operational amplifier 16 to form error signal 63 and optionally integrated in low-pass filter 17 to smooth transitions. The resulting control signal 62 can, in some embodiments, control a voltage controlled delay line, or as shown in FIG. 3, the resulting control signal 62 is converted to a digital control signal 64 in A/D converter 18 which controls the digitally controlled delay line 19 by adjusting the internal switches controlling signal path.

It should be understood that by virtue of control signal 64 controlling the variable delay line 19, the total coupled path delay of a signal originating from transmitting (interfering) antenna point 7, through the variable delay line 19, to input port 8 on the ACL 6 is dynamically and continuously adjusted, in accordance with invention principles, to compensate for the dynamically changing spatial coupling delay by matching the transmission path delay starting from point 7 and continuing through points 2, 3, and 4, and finally terminating in input port 9 of the ACL 6.

Interference Cancellation Circuit 6

A time-delayed sample of transmission signal 40 is output from variable delay line 19 as the delayed coupled signal 57 and supplied to auxiliary port 8 of ACL 6. Interfering antenna signal 30 is fed into reference port 9 of ACL 6. A cancellation signal 65 is generated by ACL 6 via the processes of autocorrelation 66, integration 67, and finally by applying a complex weight 68 of phase and amplitude. The cancellation signal 65 is provided to summing junction 70. It is noted that when the cancellation signal 65 is injected into summing junction 70 it has substantially the same amplitude as the antenna reference signal 71, i.e., interfering antenna signal 30, however, the cancellation signal 65 is manipulated so that it is 180° out of phase with the interfering antenna signal transmitted antenna signal 30 propagated and received by antenna 4 and included in antenna signal 30 so as to substantially cancel the interfering signal. As a result, the signal remaining on the protected output 58 is substantially the same as the received antenna signal 30 provided by receiver antenna 4 without the undesired contribution from interfering transmitter 1.

ATDC Response Time

The response time of the ATDC 10 is a function of signal bandwidth, the tap spacing (ΔT), loop gain (G), and integration time constant (T). Standard control loop theory applies to the design of the loop to assure stability while allowing timely convergence. Too fast of a response allows oscillations and noisy wanderings of the control signal and thus the time delay. Too slow of a response will not allow the system to respond to dynamics of the platform environment. A value of the tap spacing, ΔT needs to be selected such that it is small enough so the autocorrelation product of the signals is monotonic in the region of ±ΔT but large enough to allow sensing of the autocorrelation difference without allowing noise to unduly perturb the control. There have been many examples in prior art of adaptive arrays to improve the performance of the control loops by the use of automatic Gain Control (AGC) and limiter circuitry that are also applicable to these control loops.

The signal bandwidth can limit the range of operation of the ATDC because of the rapid degradation of the autocorrelation with time mismatch. The range of operation can be increased by limiting the bandwidth of the signal autocorrelation by filtering, thus decreasing the rate of decay of the autocorrelation function with time mismatch. This comes at the expense of robustness to platform dynamics by slowing the response time. Range of operation can also be increased by adding more taps at spacing ΔT and combining autocorrelations from all taps to determine direction of time adjustment.

It should be understood that since the improved cosite interference (ICS) system 20 is also an adaptive control system with time-varying function, the time constant of the ATDC control loop has to be adjusted such that the ICS control can track the variation of the ATDC delay.

It should also be understood that some ICS functions will have a time-varying property that could affect the match established through the use of this time delay control method. Such functions should be implemented with a position of $t_a$ 80, or $t_b$ 82, someplace after the transmission sample pickup point 7 and before the delayed sample pick-off point 85. Such functions should have their temporal response times adjusted with those of the ATDC 10 and ACL 6 to maximize system response time of improved interference cancellation system 20.

Referring again to FIG. 2 which is a diagram of ideal signal correlation of a signal of rectangular bandwidth as a function of the product of ΔT and Bandwidth showing three possible locations 202, 204, 206 of the controlling taps relative to the current delay time in respect to its match to the reference path delay. The left cluster 202 shows that the delay T, the total inline delay of the coupled transmission signal from the pick-off point 7 to the ATDC 10 sampling point 85, is insufficient and needs to be increased because the early signal 14 autocorrelation (−τ) is less than the delayed signal 59 autocorrelation (+τ). The right cluster 206 shows the opposite situation where the delay is too great. The third, center, cluster 204 shows the point of system stability where the autocorrelation values of +τ and −τ for +ΔT and −ΔT are equal.

It should be understood that transmission signals of other modulations and spectral characteristics will have different signal autocorrelation functions than those shown in FIG. 2. Design of the tap spacing and the control loop can be adjusted to work with these signals with restrictions of working within region of monotonic decay of the autocorrelation function.

It is recognized that the integration of the autocorrelation signals 310*a-b* could take place before the differencing function.

Those knowledgeable in the art will recognize that there are many alternative implementations for the discriminator function, which is shown in the present exemplary embodiment as a simple differencing operation. It is appreciated that some techniques are more suitable for scenarios where there is lower amplitude and phase mismatch in the two signal paths across the band of operation, while other techniques are more suitable for scenarios where there is higher amplitude and phase mismatch in the two signal paths across the band of operation. Moreover, each of the alternative techniques has differing levels of associated computational burden to accomplish the function. The specific implementation chosen should be a function of the type of impairment(s) in the signal path (co-channel interference, noise, multipath, amplitude/phase mismatch, bandlimiting, etc.).

It is recognized that some systems may want to have an initial or quiescent value of the digital control word, and thus T, as the starting point and that a number of methods from prior art in adaptive arrays have been used for this initialization. An example of a value would be based upon the platform dimensions and element locations.

It is recognized that the value out of the correlators for autocorrelation calculation can vary with signal level and that the use of additional gain, AGC or limiters before the correlation function can improve system performance.

It is recognized that some systems may not desire continuous operation of the adaptive time control but may desire operation only to point of steady state on turn on or by external initialization and that a number of methods from prior art in adaptive arrays have been used for the function of freezing or holding the adapted value of the digital control word.

Figure 4:
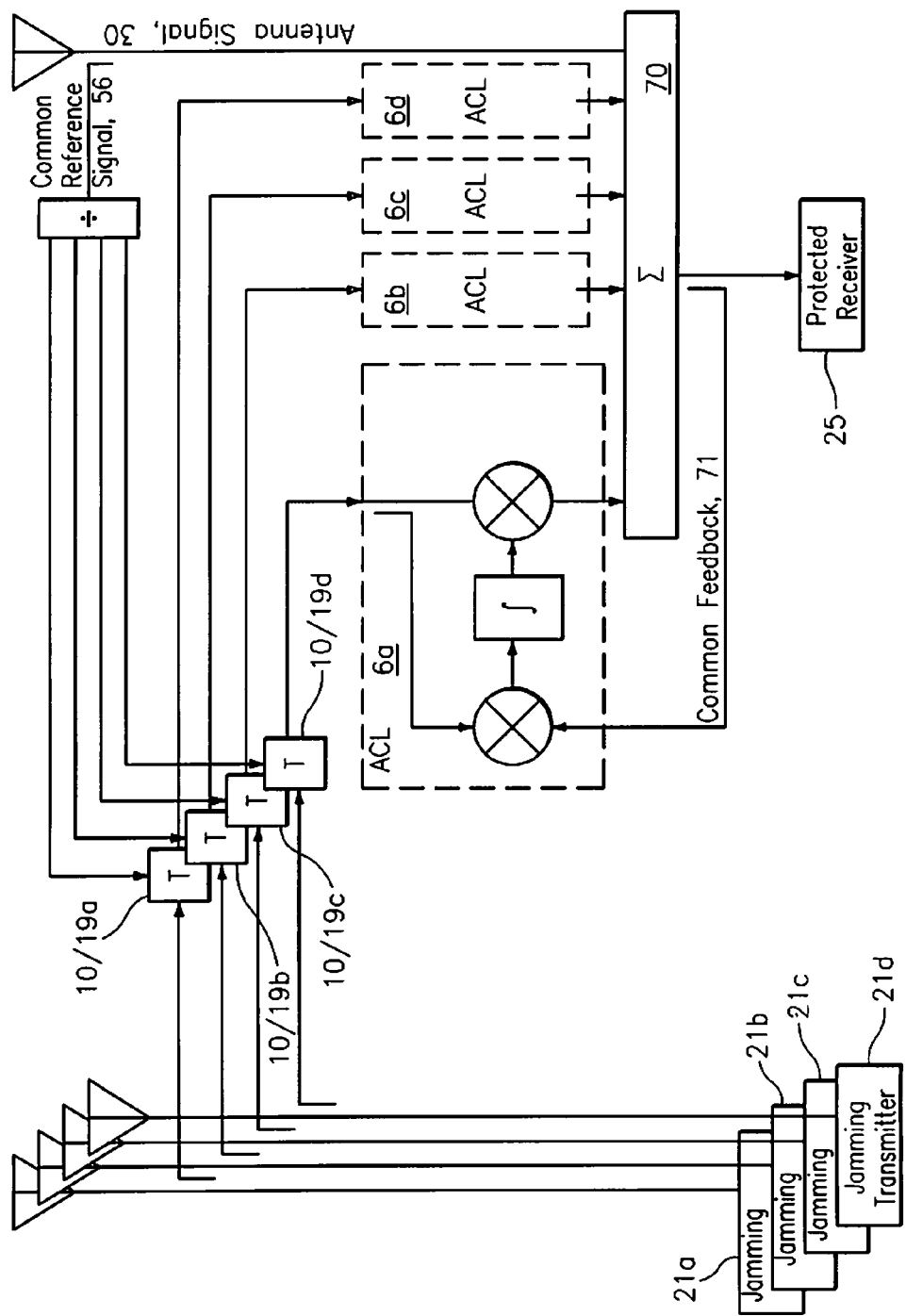
FIG. 4 illustrates one embodiment of an improved cosite interference cancellation system for elimination of interfering signals between three or more co-located transceivers.

FIG. 4 illustrates one embodiment of an improved cosite interference cancellation system 20 for elimination of interfering signals between three or more co-located transceivers. In this Figure, identical or corresponding elements and components have the same reference numerals as those in FIG. 3.

Referring now to FIG. 4 there is shown four co-located interfering transmitters 21*a*-21*d*, by way of example and not limitation. Four are shown for ease of explanation. To counteract the multiple interfering transmitters 21*a*-21*d*, and thus reduce or minimize cosite interference, the improved cosite interference cancellation system 20 includes independent adaptive time delay control module (ATDC) 10*a*-10*d* and variable delay lines 19*a*-19*d* operably coupled to four adaptive control loops (ACL) 6*a*-6*d*. Four of which are shown for ease of explanation and not limitation. In this manner, the cosite interference cancellation process described above with reference to FIG. 3 is independently applied to each interfering transmitter 21*a*-21*d* to protect the single receiver 25. This figure shows a preferred embodiment with common, shared antenna signal 56, summing junction 70 and antenna reference signal 71. The function of the variable delay lines 19*a*-19*d* are in-line and must be independent but the function of the ATDC 10*a*-10*d* can be shared through multiplexing techniques implemented in prior art of adaptive arrays where the correlation and integration functions were shared. In other embodiments, the ICS summing junctions are daisy-chained for the use of a standard building block at the cost of additional potential noise insertions and longer convergence times because of signal interaction.

Figure 5:
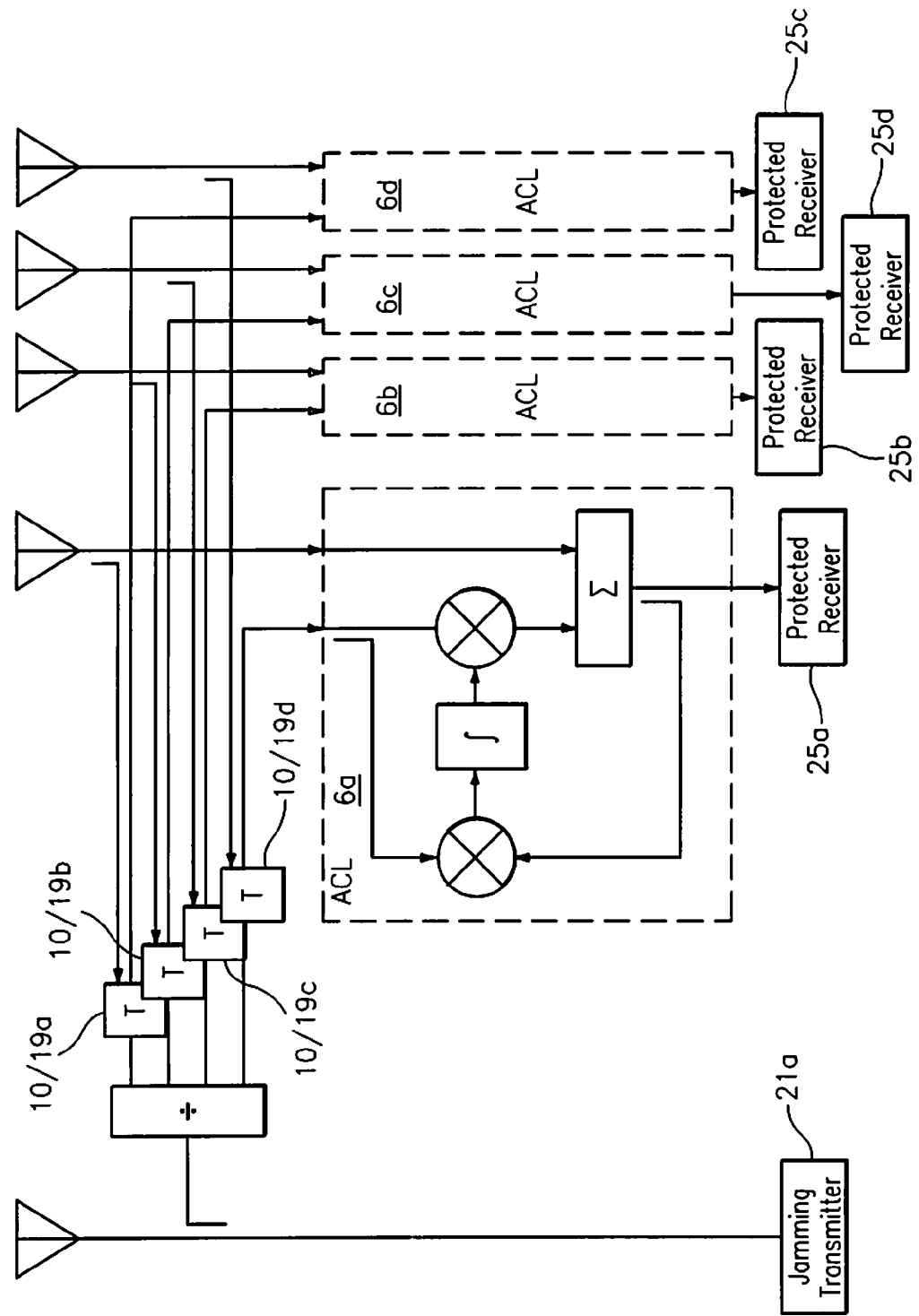
FIG. 5 illustrates one embodiment of an improved cosite interference cancellation system for elimination of interfering signals between a single co-located transceiver and a plurality of receivers to be protected.

Referring now to FIG. 5 there is shown an improved cosite interference cancellation system 20 for elimination of interfering signals between a single co-located transceiver 21 and a plurality of receivers to be protected. In the presently described embodiment, it is desired to protect a multiplicity of receivers, 25*a*-25*d*, four of which are shown by way of example and not limitation. To protect the plurality of receivers 25*a*-25*d*, each receiver is coupled to a corresponding adaptive control loops (ACL) 6*a*-6*d* operably coupled with associated independent adaptive time delay control modules (ATDC) 10*a*-10*d* and variable delay lines 19*a*-19*d*.

The foregoing is to construed as only being an illustrative embodiment of this invention. Persons skilled in the art can easily conceive of alternative arrangements providing a functionality similar to this embodiment without any deviation from the fundamental principles or the scope of the invention.

What is claimed is:

1. An interference cancellation system, comprising:
   (A) a variable delay line (19) for adjusting a signal propagation time of a sampled transmission signal (40) propagated through a controlled propagation path, the variable delay line (19) comprising a delay having an adjustment range to compensate for delay differences in the sampled signal path and an uncontrolled propagation path, the delay comprising:
   at least one fixed delay element; and
   a variable delay element continuously varying a delay of sampled transmission signal to implement a match between the sampled transmission signal and a propagated received signal propagated through the uncontrolled propagation path yielding a delayed coupled signal;
   (B) an adaptive time delay control (ATDC) module (10) for receiving the sampled transmission signal and the propagated received signal, delaying the sampled transmission signal and the propagated received signal, generating a first autocorrelation value from the sampled transmission signal and the delayed propagated received signal, generating a second autocorrelation value from the delayed sampled transmission signal and the delayed propagated received signal, and continuously calculating a delay based on the first and second autocorrelation values to be added to the controlled propagation path through the variable delay element to achieve a match of the sampled transmission signal passing through the controlled propagation path with the propagated received signal passing through the uncontrolled propagation path; and (C) an adaptive control loop (6) for adjusting a complex weighting of the delayed coupled signal (57) to maximally cancel the sampled transmission signal received in the propagated received signal (30).

2. The interference cancellation system of claim 1, wherein the variable delay line (19) is a voltage controlled delay line.

3. The interference cancellation system of claim 1, wherein the variable delay line (19) is a digitally controlled delay line.

4. The interference cancellation system of claim 1, wherein the adaptive time delay control (ATDC) module (10) is configured to provide continuous, non-interrupting, adjustment of the variable delay line (19).

5. The interference cancellation system of claim 1, wherein the adaptive control loop (6) is configured to adjust only phase and amplitude of the delayed sampled signal to cancel coupled received signal in the propagated path, and wherein the ATDC is configured to adjust the delay to achieve the match between the sampled transmission signal and the propagated received signal.

6. The interference cancellation system of claim 1, wherein the adaptive control loop (6) adjusts only phase and amplitude of the delayed sampled signal to cancel coupled received signal in the propagated path, wherein the phase and amplitude adjustment is implemented by In-phase and Quadrature weighting, and wherein the ATDC is configured to adjust the delay to achieve the match between the sampled transmission signal and the propagated received signal.

* * * * *